United States Patent
Zhang et al.

(10) Patent No.: US 10,651,267 B2
(45) Date of Patent: May 12, 2020

(54) PRODUCTION METHOD OF CAPACITOR STRUCTURE, CAPACITOR STRUCTURE, AND SENSOR

(71) Applicants: Hefei Xinsheng Optoelectronics Technology Co., Ltd., Hefei (CN); BOE TECHNOLOGY GROUP CO., LTD., Beijing (CN)

(72) Inventors: Youting Zhang, Beijing (CN); Weijie Ma, Beijing (CN); Ming Zhang, Beijing (CN); Shichao Fei, Beijing (CN); Haifeng Hu, Beijing (CN); Jun Chen, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/387,463

(22) Filed: Apr. 17, 2019

(65) Prior Publication Data
US 2020/0098852 A1  Mar. 26, 2020

(30) Foreign Application Priority Data
Sep. 26, 2018  (CN) .......................... 2018 1 1126866

(51) Int. Cl.
*H01L 21/321* (2006.01)
*H01L 49/02* (2006.01)
(Continued)

(52) U.S. Cl.
CPC .............. *H01L 28/60* (2013.01); *C23C 16/04* (2013.01); *G01L 1/142* (2013.01); *G01P 15/125* (2013.01);
(Continued)

(58) Field of Classification Search
CPC .......................... H01L 21/32139; H01L 28/60
See application file for complete search history.

(56) References Cited

U.S. PATENT DOCUMENTS 6,640,432 B1 * 11/2003 Mathieu ............ G01R 1/07378
257/E23.021
7,451,653 B1 * 11/2008 Sippola ................. G01L 9/0042
73/715
(Continued)

FOREIGN PATENT DOCUMENTS

| CN | 104142206 A | 11/2014 |
| CN | 104649213 A | 5/2015 |

(Continued)

OTHER PUBLICATIONS

Kang et al. "Fully Roll-toRoll Gravure Printable Wireless (13.56 MHz) Sensor-Signage Tags for Smart Packaging," Scientific Reports 4:5387. (Year: 2014).*

(Continued)

*Primary Examiner* — Matthew L Reames
(74) *Attorney, Agent, or Firm* — Kinney & Lange, P.A.

(57) ABSTRACT

There is provided a production method of a capacitor structure, having the following steps: forming a bottom electrode on a substrate; forming a sacrificial layer, which covers at least one part of the bottom electrode, on the substrate; forming a top electrode, which traverses the bottom electrode and covers at least one part of the sacrificial layer, on the substrate, such that a sacrificial layer is present at a part where an orthographic projection of the top electrode on the substrate and an orthographic projection of the bottom electrode on the substrate overlap; removing the sacrificial layer with a sacrificial layer removing solution to form an air gap. There are also provided a capacitor structure and a sensor.

9 Claims, 9 Drawing Sheets

(51) Int. Cl.
    *H01G 4/005*      (2006.01)
    *H01G 5/16*       (2006.01)
    *H01L 21/3213*    (2006.01)
    *G01P 15/125*     (2006.01)
    *G01L 1/14*       (2006.01)
    *C23C 16/04*      (2006.01)
(52) U.S. Cl.
    CPC ............... *H01G 4/005* (2013.01); *H01G 5/16* (2013.01); *H01L 21/32139* (2013.01)

(56) References Cited

U.S. PATENT DOCUMENTS

| | | | |
|---|---|---|---|
| 7,732,241 B2* | 6/2010 | Yamaguchi | B81C 1/00682 438/52 |
| 9,899,597 B2 | 2/2018 | Zhou | |
| 2007/0096300 A1* | 5/2007 | Wang | B81B 3/0072 257/709 |

FOREIGN PATENT DOCUMENTS

| CN | 105304832 A | 2/2016 |
|---|---|---|
| CN | 108428511 A | 8/2018 |

OTHER PUBLICATIONS

Park et al. "Roll-to-Roll infrared and hot-air sintering of gravure-printed Ag layer based on in situ tension measuring analysis," Journal of Materials Chemisty 2016 4, 8884. (Year: 2016).*
First Chinese Office Action dated Nov. 28, 2019, received for corresponding Chinese Application No. 201811126866.1, 18 pages.

* cited by examiner

| attaching a first mask layer into the substrate with the bottom electrode formed thereon, wherein the first mask layer comprises a first hollowed-out region, and the first hollowed-out region and an orthographic projection of the sacrificial layer to be formed on the substrate overlap | ~ S21 |
|---|---|

| forming a sacrificial layer in the first hollowed-out region by a coating process | ~ S22 |
|---|---|

| removing the first mask layer from the substrate | ~ S23 |
|---|---|

Fig. 7b first direction

| attaching a second mask layer onto the substrate with the sacrificial layer formed thereon, wherein the second mask layer comprises a second hollowed-out region and the second hollowed-out region and an orthographic projection of the top electrode to be formed on the substrate overlap | —S31 |

| forming the top electrode by a coating process in the second hollowed-out region | —S32 |

| removing the second mask layer from the substrate | —S33 |

Fig. 10b first direction

PRODUCTION METHOD OF CAPACITOR STRUCTURE, CAPACITOR STRUCTURE, AND SENSOR

CROSS-REFERENCE TO RELATED APPLICATION

This application claims the priority of Chinese Patent Application No. 201811126866.1 filed on Sep. 26, 2018, which is incorporated herein by reference in its entirety.

TECHNICAL FIELD

The present disclosure relates to the technical field of sensors, and particularly to a production method of a capacitor structure, a capacitor structure, and a sensor.

BACKGROUND

At present, sensors have been more and more widely used, and their properties are higher and higher as the technology develops.

With respect to sensors comprising a gap type capacitor structure such as pressure sensors, acceleration sensors, and the like, the gap type capacitor structure is produced by a photolithographic etching process. Therefore, the cost of the photolithographic etching process is high and it is disadvantageous to the reduction of the cost of the sensor on the one hand; and the requirements for the substrate are high due to high temperature required for the photolithographic etching process on the other hand.

SUMMARY

In one aspect, there is provided a production method of a capacitor structure, wherein the production method comprises:
forming a bottom electrode on a substrate;
forming a sacrificial layer, which covers at least one part of the bottom electrode, on the substrate;
forming a top electrode, which traverses the bottom electrode and covers at least one part of the sacrificial layer, on the substrate, such that a sacrificial layer is present at a part where an orthographic projection of the top electrode on the substrate and an orthographic projection of the bottom electrode on the substrate overlap;
removing the sacrificial layer with a sacrificial layer removing solution to form an air gap.

Optionally, said forming a bottom electrode on a substrate is performed by a printing process;
said forming a sacrificial layer, which covers at least one part of the bottom electrode, on the substrate is performed by a first coating process;
said forming a top electrode, which traverses the bottom electrode and covers at least one part of the sacrificial layer, on the substrate is performed by a second coating process; and
said removing the sacrificial layer with a sacrificial layer removing solution is performed by placing the substrate with the bottom electrode, the sacrificial layer, and the top electrode formed thereon in the sacrificial layer removing solution.

Optionally, the first coating process comprises:
attaching a first mask layer comprising a first hollowed-out region onto the substrate with the bottom electrode formed thereon, such that an orthographic projection of the first hollowed-out region on the substrate and an orthographic projection of the sacrificial layer to be formed on the substrate overlap;
forming the sacrificial layer by a coating process in the first hollowed-out region; and
removing the first mask layer from the substrate.

Further optionally, said forming the sacrificial layer by a coating process in the first hollowed-out region comprises:
coating a mixture comprising polydimethylsiloxane and a curing agent into the first hollowed-out region, heating the mixture, and forming the sacrificial layer after heat-shaping; and
said removing the sacrificial layer with a sacrificial layer removing solution comprises: placing the substrate with the bottom electrode, the sacrificial layer, the top electrode formed thereon in a tetrabutylammonium fluoride solution used as the sacrificial layer removing solution, and heating the tetrabutylammonium fluoride solution to remove the sacrificial layer.

Optionally, the first mask layer is formed by a pressing process.

Optionally, material of the first mask layer comprises polyimide and a binder.

Optionally, the second coating process comprises:
attaching a second mask layer comprising a second hollowed-out region onto the substrate with the sacrificial layer formed thereon, such that an orthographic projection of the second hollowed-out region on the substrate and an orthographic projection of the top electrode to be formed on the substrate overlap;
forming the top electrode by a coating process in the second hollowed-out region;
removing the second mask layer from the substrate.

Optionally, the substrate is a flexible substrate.

Further optionally, said forming a bottom electrode on a substrate comprises: forming the bottom electrode which is patterned on the substrate by roll-to-roll gravure printing, and transferring the substrate with the bottom electrode formed thereon to an infrared oven of a roll-to-roll gravure printing machine to dry the bottom electrode.

Optionally, a tensile strength of the top electrode is lower than a tensile strength of the bottom electrode.

Further optionally, materials of both the bottom electrode and the top electrode comprise silver.

In another aspect, there is provided a capacitor structure produced by the production method described above.

In a yet another aspect, there is provided a sensor, comprising the capacitor structure described above.

BRIEF DESCRIPTION OF THE DRAWINGS

In order to illustrate the technical solutions in embodiments of the present disclosure or in the prior art more clearly, figures required for describing the embodiments or the prior art will be simply introduced below. It is apparent that the figures described below are merely some embodiments of the present disclosure, and other figures may be further obtained by those of ordinary skill in the art according to these figures without exerting inventive work.

FIG. 4a is a schematic plan view of forming a top electrode on the basis of FIG. 3a;

FIG. 5a is a schematic plan view of forming a capacitor structure after removing a sacrificial layer on the basis of FIG. 4a;

DETAILED DESCRIPTION OF EMBODIMENTS

A production method of a capacitor structure, a capacitor structure, and a sensor are provided in embodiments of the present disclosure, and a capacitor structure in a sensor may be formed without a photolithographic etching process.

A production method of a capacitor structure, a capacitor structure, and a sensor are provided in embodiments of the present disclosure, and a gap type capacitor structure may be formed by producing a bottom electrode by a printing process, producing a sacrificial layer and a top electrode by coating processes, and removing the sacrificial layer by a solution method. Here, since the photolithographic etching process is not used during the formation of the gap type capacitor structure described above, the cost may be reduced. Furthermore, since the process temperature is no more than that of the photolithographic etching process regardless of processes of typing, printing, and coating process, the requirements for the substrate are relatively low in the present disclosure and various materials may be suitable for the substrate.

The technical solutions in the embodiments of the present disclosure will be described clearly and fully below in conjunction with accompanying drawings in embodiments of the present disclosure. Obviously, the embodiments described are merely part of the embodiments of the present disclosure, rather than all of the embodiments. Based on the embodiments in this disclosure, all other embodiments obtained by those of ordinary skill in the art without performing inventive work belong to the scope protected by this disclosure.

Reference numerals in the accompanying drawings have the representations as follows, respectively: 10—substrate; 20—bottom electrode; 30—sacrificial layer; 31—first part; 32—second part; 40—top electrode; 41—third part; 42—fourth part; 50—first mask layer; 51—first hollowed-out region; 60—second mask layer; 61—second hollowed-out region.

An embodiment of the present disclosure provides a production method of a capacitor structure, comprising:

forming a bottom electrode on a substrate;

forming a sacrificial layer, which covers at least one part of the bottom electrode, on the substrate;

forming a top electrode, which traverses the bottom electrode and covers at least one part of the sacrificial layer, on the substrate, such that a sacrificial layer is present at a part where an orthographic projection of the top electrode on the substrate and an orthographic projection of the bottom electrode on the substrate overlap;

removing the sacrificial layer with a sacrificial layer removing solution to form an air gap.

The capacitor structure having an air gap between the bottom electrode and the top electrode may be used in a sensor having a gap type capacitor structure such as a pressure sensor and an acceleration sensor.

In the method of the present disclosure, a gap type capacitor structure may be formed without a photolithographic etching process. In the method of the present disclosure, steps may be finished in a non-photolithographic manner such as printing, typing, coating, dissolution, and the like. In the method of the present disclosure, an air gap is obtained by sequentially printing, typing, or coating a bottom electrode, a sacrificial layer, and a top electrode, and then removing the sacrificial layer between the bottom electrode and the top electrode with a sacrificial layer removing solution. The sacrificial layer removing solution may be typically a solution which dissolves the sacrificial layer but does not dissolve an electrode material or a substrate material.

Figure 1:
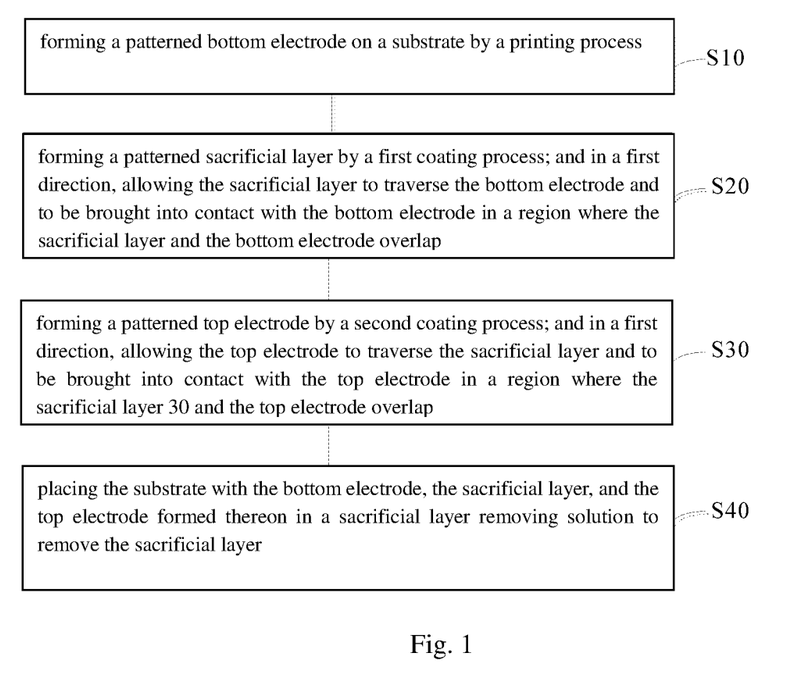
FIG. 1 is a schematic flow chart of a production method of a capacitor structure provided in an embodiment of the present disclosure.

Particularly, an embodiment of the present disclosure provides a production method of a capacitor structure, as shown in FIG. 1, comprising the following steps.

Figure 2:
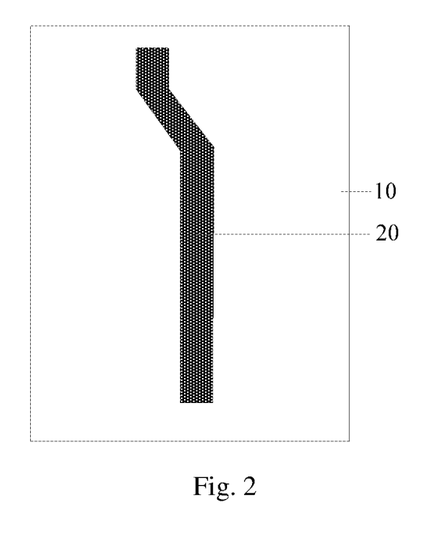
FIG. 2 is a schematic plan view of forming a bottom electrode on a substrate provided in an embodiment of the present disclosure.

S10: as shown in FIG. 2, forming a patterned bottom electrode 20 on a substrate 10 by a printing process.

Exemplarily, the patterned bottom electrode 20 may be formed by an inkjet printing process.

Exemplarily, the patterned bottom electrode 20 may be formed by a gravure printing process or a screen printing process.

Figure 3A:
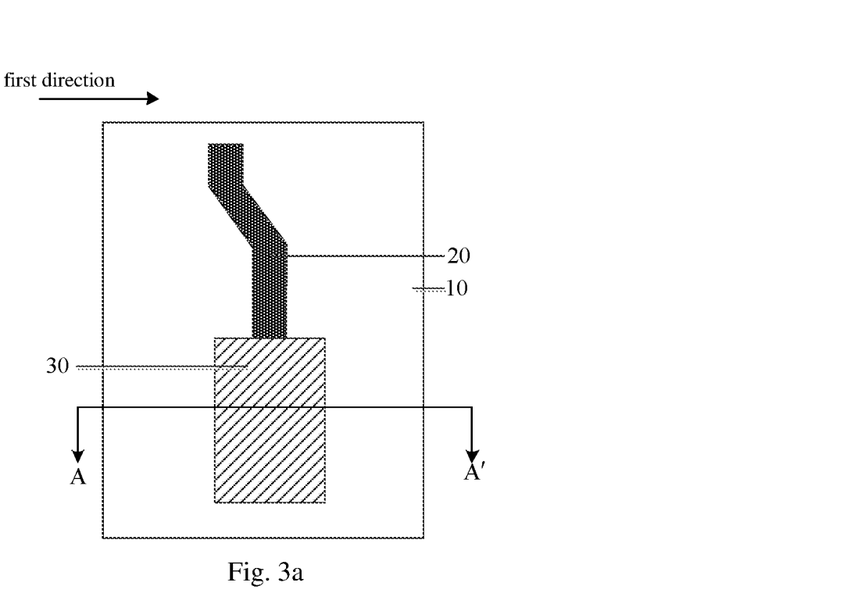
FIG. 3a is a schematic plan view of forming a sacrificial layer on the basis of FIG. 2.
Figure 3B:
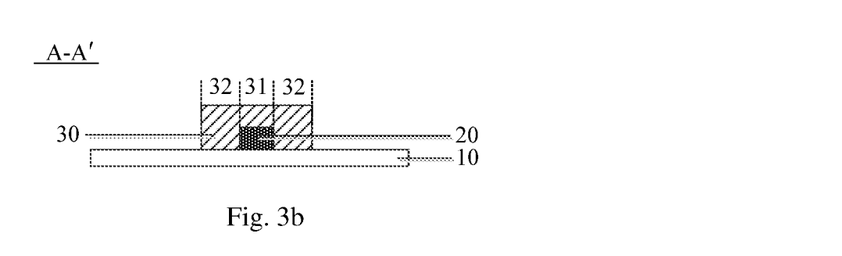
FIG. 3b is schematic sectional view of FIG. 3a in an AA' direction.

S20: as shown in FIG. 3a and FIG. 3b, forming a patterned sacrificial layer 30 by a first coating process; and in a first direction, allowing the sacrificial layer 30 to traverse the bottom electrode 20 and to be brought into contact with the bottom electrode 20 in a region where the sacrificial layer 30 and the bottom electrode 20 overlap. That is, the sacrificial layer at least covers a part of the bottom electrode. Furthermore, the sacrificial layer is in contact with the substrate. In this disclosure, the specific manner of the coating process may be appropriately selected from spin coating, spray coating, dip coating, and the like.

That is, the sacrificial layer 30 comprises a first part 31 overlapping the bottom electrode 20 and second parts 32 located on both sides of the bottom electrode 20 along a first direction, as shown in FIG. 3b. The first part 31 is in contact with the top surface of the bottom electrode 20, and the second parts 32 located on both sides of the bottom electrode 20 are in contact with side surfaces of the bottom electrode 20. The top surface of the bottom electrode 20 refers to the surface of the bottom electrode 20 away from the substrate 10.

Since the thickness of the first part 31 determines the distance between the bottom electrode 20 and the top electrode 40 subsequently formed, the thickness of the first part 31 may be determined according to property parameters of the capacitor structure.

It is to be indicated that the first direction may be perpendicular to the extension direction of the bottom electrode 20, for example, in a region where a capacitor structure is formed in a sensor.

Figure 4A:
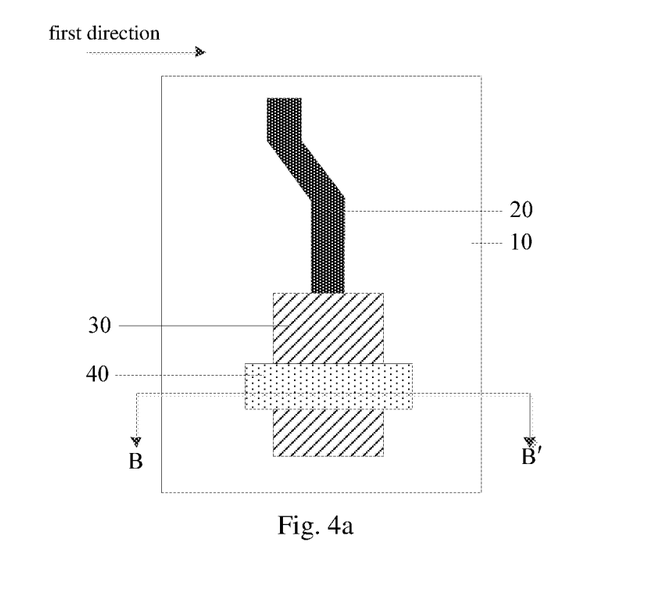
Figure 4B:
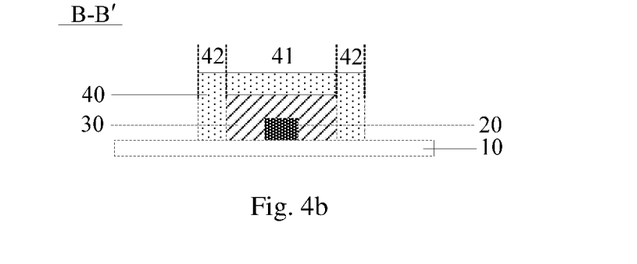
FIG. 4b is schematic sectional view of FIG. 4a in a BB' direction.

S30: as shown in FIG. 4a and FIG. 4b, forming a patterned top electrode 40 by a second coating process; and in a first direction, allowing the top electrode 40 to traverse the sacrificial layer 30 and to be brought into contact with the top electrode 40 in a region where the sacrificial layer 30 and the top electrode 40 overlap. That is, the top electrode at least covers a part of the sacrificial layer. Furthermore, the top electrode is in contact with the substrate. Additionally, a sacrificial layer is present at a part where an orthographic projection of the top electrode on the substrate and an orthographic projection of the bottom electrode on the substrate overlap.

That is, the top electrode 40 comprises a third part 41 overlapping the sacrificial layer 30 and fourth parts 42 located on both sides of the sacrificial layer 30, as shown in FIG. 4b. The third part 41 is in contact with the top surface of the sacrificial layer 30, and the fourth parts 42 located on both sides of the sacrificial layer 30 are in contact with side surfaces of the sacrificial layer 30. The top surface of the sacrificial layer 30 refers to the surface of the sacrificial layer 30 away from the substrate 10.

Figure 5A:
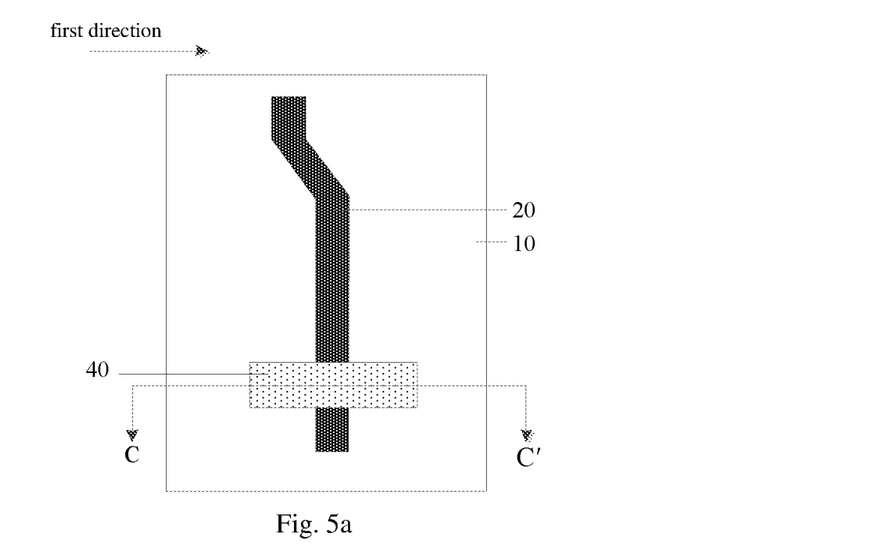
Figure 5B:
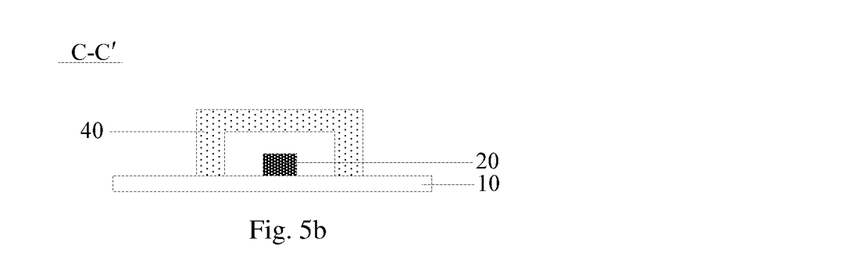
FIG. 5b is schematic sectional view of FIG. 5a in a CC' direction.

S40: as shown in FIG. 5a and FIG. 5b, placing the substrate 10 with the bottom electrode 20, the sacrificial layer 30, and the top electrode 40 formed thereon in a sacrificial layer removing solution to remove the sacrificial layer 30.

That is, the sacrificial layer 30 is removed by allowing dissolution or chemical reaction occurring between the sacrificial layer removing solution and the sacrificial layer 30.

Therefore, when selecting the material of the sacrificial layer 30 and the sacrificial layer removing solution described above, the etching of the bottom electrode 20 and the top electrode 40 should be prevented as much as possible. On the basis of above, when the sacrificial layer 30 is formed in S20, an easily soluble material may be selected to produce the sacrificial layer 30.

After the sacrificial layer 30 is removed, a certain gap is allowed to be present between the top electrode 40 and the bottom electrode 20 so as to form a gap type capacitor structure. In a production method of a capacitor structure provided in an embodiment of the present disclosure, a gap type capacitor structure may be formed by producing a bottom electrode 20 by a printing process, producing a sacrificial layer 30 and a top electrode 40 by a coating process, and removing the sacrificial layer 30 by a solution method. Here, since the photolithographic etching process is not used during the formation of the gap type capacitor structure described above, the cost may be reduced. Furthermore, since the process temperature is no more than that of the photolithographic etching process regardless of processes of typing, printing, and coating process, the requirements for the substrate 10 are relatively low in the present disclosure and various materials may be suitable for the substrate 10.

Optionally, the substrate 10 is a flexible substrate 10.

The material of the substrate 10 may be selected from at least one of polyethylene terephthalate (PET), polycarbonate, polyethylene, polyacrylate, and the like.

By producing the substrate 10 into a flexible substrate 10, the range of application of sensors may be allowed to be wider.

On the basis of above, forming the patterned bottom electrode 20 on the substrate 10 by a printing process in S10 comprises:

forming the patterned bottom electrode 20 by roll-to-roll gravure printing, and transferring the substrate 10 with the bottom electrode 20 formed thereon to an infrared oven of a roll-to-roll gravure printing machine to dry the bottom electrode 20.

Since an infrared oven is set in a roll-to-roll gravure printing apparatus, the process is simpler when the patterned bottom electrode 20 is formed by roll-to-roll gravure printing. Furthermore, the bottom electrode 20 may be allowed to be rapidly shaped and the properties of the product are better.

Figure 6:
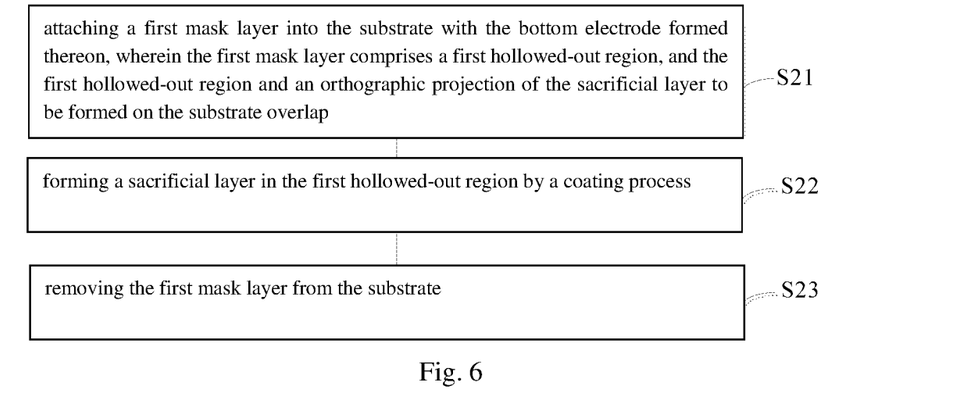
FIG. 6 is a schematic flow chart of forming a sacrificial layer provided in an embodiment of the present disclosure.

Optionally, forming the patterned sacrificial layer 30 by a coating process in S20, as shown in FIG. 6, comprises the following steps.

Figure 7A:
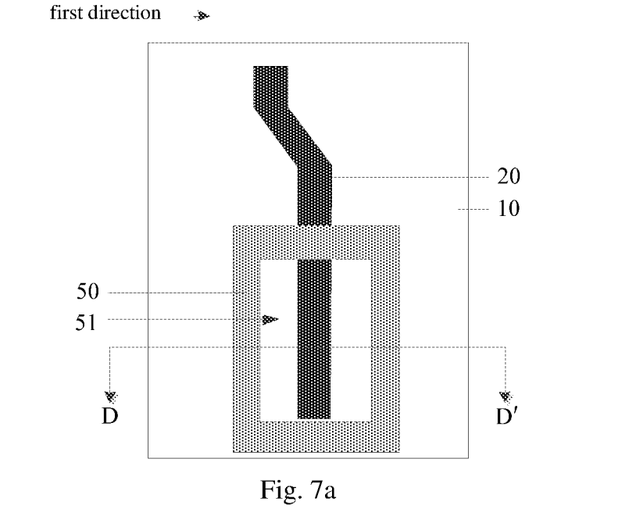
FIG. 7a is a schematic plan view of forming a first mask layer on a bottom electrode provided in an embodiment of the present disclosure.
Figure 7B:
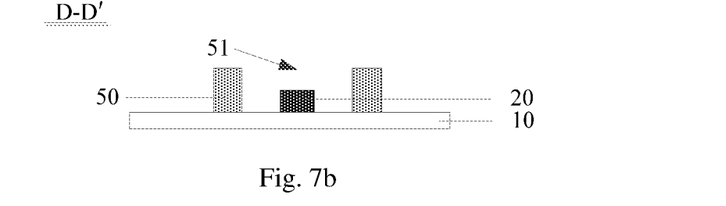
FIG. 7b is schematic sectional view of FIG. 7a in a DD' direction.

S21: as shown in FIG. 7a and FIG. 7b, attaching a first mask layer 50 onto the substrate 10 with the bottom electrode 20 formed thereon, wherein the first mask layer 50 comprises a first hollowed-out region 51, and the first hollowed-out region 51 and an orthographic projection of the sacrificial layer 30 to be formed on the substrate 10 overlap.

The orthographic projection refers to the projection along the thickness direction of the substrate 10.

Since the sacrificial layer 30 in contact with the bottom electrode 20 is to be subsequently formed in the first hollowed-out region 51, the material of the first mask layer 50 is completely removed in the first hollowed-out region 51. Thus, when the first mask layer 50 is attached onto the substrate 10, the bottom electrode 20 may be exposed so that the first hollowed-out region 51 is used for forming the sacrificial layer 30.

Here, the first hollowed-out region 51 and an orthographic projection of the sacrificial layer 30 to be formed on the substrate 10 overlap. That is, the shape and the dimension of the edge of the first hollowed-out region 51 are consistent with those of the sacrificial layer 30 to be formed.

Exemplarily, the attachment of the first mask layer 50 onto the substrate 10 may be achieved by two manners as follows.

Manner one: the first mask layer 50 comprises a first mask layer main body and an adhesive layer, and the first mask layer 50 is attached onto the substrate 10 by the adhesion of the adhesive layer to the substrate 10.

Manner two: the first mask layer 50 per se is adhesive, i.e., a certain binder is mixed in the material of the first mask layer 50 so that the first mask layer 50 may be directly attached onto the substrate 10.

Here, the first mask layer 50 may be formed by a pressing process. The process is simple when the first mask layer 50 is formed by a pressing process, and the shape, the size, and the like of the first hollowed-out region 51 may be adjusted as needed.

Figure 12A:
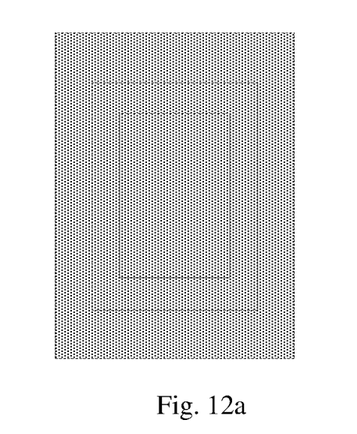
FIG. 12a is a schematic plan view of imprinting a pattern of a first mask layer on a film provided in an embodiment of the present disclosure.
Figure 12B:
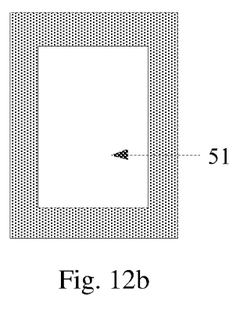
FIG. 12b is a schematic view of a first mask layer provided in an embodiment of the present disclosure.

The procedure of forming the first mask layer 50 by a pressing process comprises: pressing a pattern of the first mask layer 50 on a sheet of film for forming the first mask layer 50, as shown in FIG. 12a; and separating the first mask layer 50 from the film, as shown in FIG. 12b.

Figure 8A:
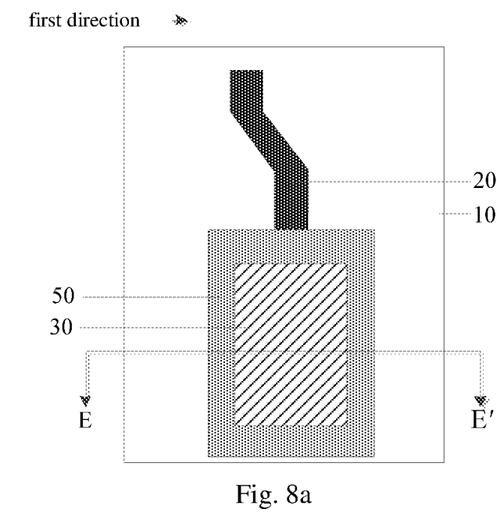
FIG. 8a is a schematic plan view of forming a sacrificial layer in a first hollowed-out region in a first mask layer provided in an embodiment of the present disclosure.
Figure 8B:
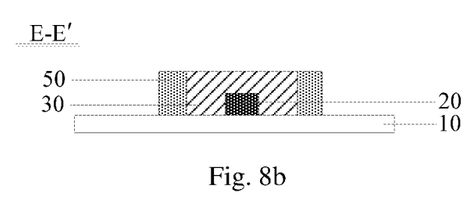
FIG. 8b is schematic sectional view of FIG. 8a in an EE' direction.

S22: as shown in FIG. 8a and FIG. 8b, forming a sacrificial layer 30 in the first hollowed-out region 51 by a coating process.

Exemplarily, the material of the sacrificial layer 30 may be spin-coated into the first hollowed-out region 51 to form the sacrificial layer 30 by using a spin coating apparatus.

Here, the thickness of the sacrificial layer 30 should be no more than that of the first mask layer 50. That is, the upper surface of the sacrificial layer 30 may be at the same level as the upper surface of the first mask layer 50, or the upper surface of the sacrificial layer 30 may be lower than that of the first mask layer 50.

S23: removing the first mask layer 50 from the substrate 10.

Here, the manner of removing the first mask layer 50 is not limited, and for example, it may be directly peeling the first mask layer 50 from the substrate 10.

In the production method of the sacrificial layer 30 provided in an embodiment of the present disclosure, the first mask layer 50 comprising the first hollowed-out region 51 is first attached onto the substrate 10 with the bottom electrode 20 formed thereon and then the sacrificial layer 30 is coated and formed in the first hollowed-out region 51 of the first mask layer 50, and the desired sacrificial layer 30 may be formed by taking advantage of the characteristic that the first hollowed-out regions 51 having various shapes are easily formed by the first mask layer 50.

Optionally, forming the sacrificial layer 30 in the first hollowed-out region 51 by a coating process in S22 comprises: coating a mixture comprising polydimethylsiloxane (PDMS) and a curing agent into the first hollowed-out region 51, heating the mixture, and forming the sacrificial layer 30 after heat-shaping.

Here, after the mixture is coated into the first hollowed-out region 51, the mixture coated into the first hollowed-out region 51 may be heated by providing a heating plate on one side of the substrate 10 so that the sacrificial layer 30 may be rapidly shaped.

On the basis of above, placing the substrate 10 with the bottom electrode 20, the sacrificial layer 30, and the top electrode 40 formed thereon in a sacrificial layer removing solution to remove the sacrificial layer 30 comprises: placing the substrate 10 with the bottom electrode 20, the sacrificial layer 30, and the top electrode 40 formed thereon in a tetrabutylammonium fluoride (TBAF) solution and heating the TBAF solution to remove the sacrificial layer 30.

After the sacrificial layer 30 is removed and the substrate 10 formed with the gap type capacitor structure is removed from the sacrificial layer removing solution, the substrate 10 formed with the gap type capacitor structure may be flushed with isopropanol.

The TBAF solution comprises TBAF and water, wherein the proportion by mass of TBAF in the solution is 70% to 80%.

The sacrificial layer 30 is produced by mixing PDMS and a curing agent at a certain ratio. On the one hand, it may be favorable to the removal of the sacrificial layer 30 after the top electrode 40 is formed by taking advantage of the characteristic that PDMS is soluble in the TBAF solution, wherein the sacrificial layer 30 may be dissolved more rapidly by heating the TBAF solution so as to further reduce the influence on the bottom electrode 20 and the top electrode 40. On the other hand, the addition of the curing agent may allow the sacrificial layer 30 to be shaped more rapidly by heating the mixture.

Figure 9:
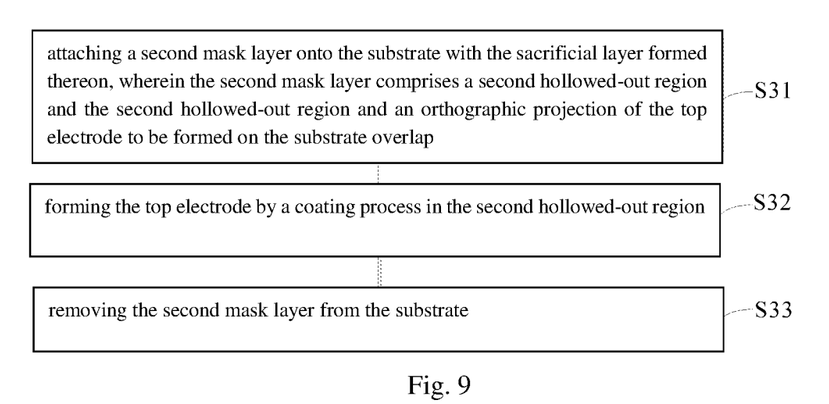
FIG. 9 is a schematic flow chart of forming a top electrode provided in an embodiment of the present disclosure.

Optionally, forming the patterned top electrode 40 by a coating process in S30, as shown in FIG. 9, comprises the following steps.

Figure 10A:
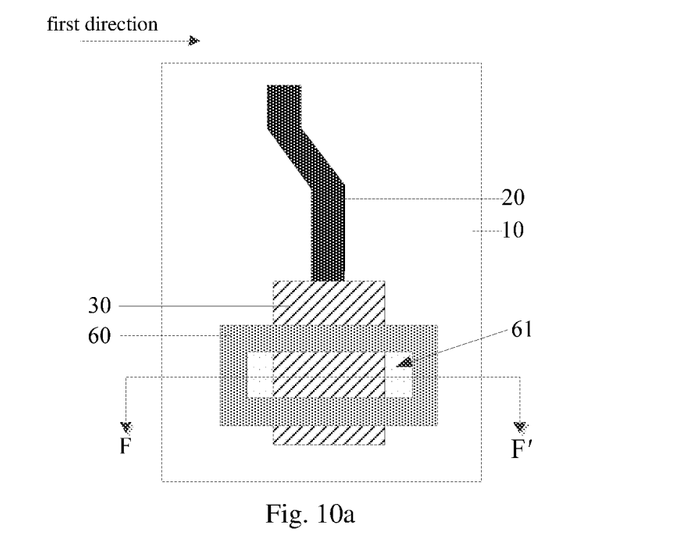
FIG. 10a is a schematic plan view of forming a second mask layer on a sacrificial layer provided in an embodiment of the present disclosure.
Figure 10B:
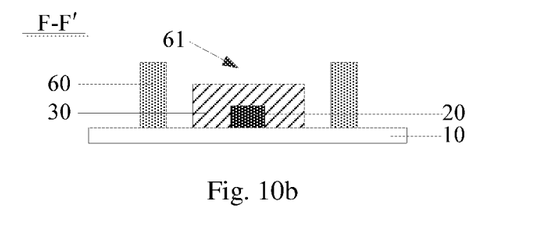
FIG. 10b is schematic sectional view of FIG. 10a in an FF' direction.

S31, with reference to those as shown in FIG. 10a and FIG. 10b, attaching a second mask layer 60 onto the substrate 10 with the sacrificial layer 30 formed thereon, wherein the second mask layer 60 comprises a second hollowed-out region 61 and the second hollowed-out region 61 and an orthographic projection of the top electrode 40 to be formed on the substrate 10 overlap.

Since the top electrode 40 in contact with the sacrificial layer 30 is to be subsequently formed in the second hollowed-out region 61, the material of the second mask layer 60 is completely removed in the second hollowed-out region 61. Thus, when the second mask layer 60 is attached onto the substrate 10, the sacrificial layer 30 may be exposed so that the second hollowed-out region 61 is used for forming the top electrode 40.

Here, the second hollowed-out region 61 and an orthographic projection of the top electrode 40 to be formed on the substrate 10 overlap. That is, the shape and the dimension of the edge of the second hollowed-out region 61 are consistent with those of the top electrode 40 to be formed.

Exemplarily, the attachment of the second mask layer 60 onto the substrate 10 may be achieved by two manners as follows.

Manner one: the second mask layer 60 comprises a second mask layer main body and an adhesive layer, and the second mask layer 60 is attached onto the substrate 10 by the adhesion of the adhesive layer to the substrate 10.

Manner two: the second mask layer 60 per se is adhesive, i.e., a certain binder is mixed in the material of the second mask layer 60 so that the second mask layer 60 may be directly attached onto the substrate 10.

Here, the second mask layer 60 may be formed by a pressing process. The process is simple when the second mask layer 60 is formed by a pressing process, and the shape, the size, and the like of the second hollowed-out region 61 may be adjusted as needed.

It is to be indicated that the procedure of forming the second mask layer 60 is similar to the procedure of forming the first mask layer 50, and verbose words are omitted herein.

Figure 11A:
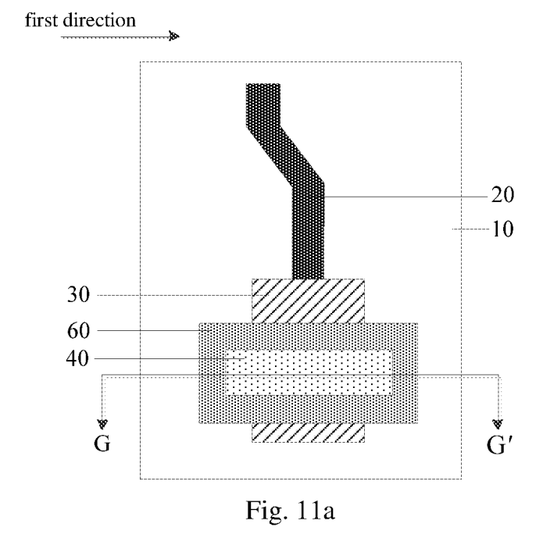
FIG. 11a is a schematic plan view of forming a top electrode in a second hollowed-out region in a second mask layer provided in an embodiment of the present disclosure.
Figure 11B:
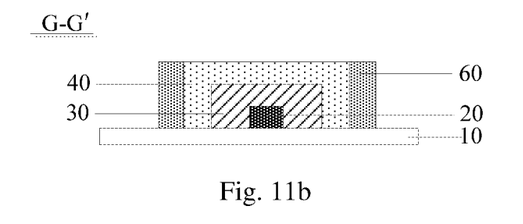
FIG. 11b is schematic sectional view of FIG. 11a in a GG' direction.

S32: as shown in FIG. 11a and FIG. 11b, forming the top electrode 40 by a coating process in the second hollowed-out region 61.

Exemplarily, the material of the top electrode 40 may be spin-coated into the second hollowed-out region 61 to form the top electrode 40 by using a spin coating apparatus.

After the material of the top electrode 40 is coated into the second hollowed-out region 61, the material of the second hollowed-out region 61 may be dried by heating for a certain period so as to form the top electrode 40 after dry molding.

The object of heating is faster dry and shaping.

Here, after the material of the top electrode 40 is coated into the second hollowed-out region 61, the material coated into the second hollowed-out region 61 may be dried by providing a heating plate on one side of the substrate 10.

The thickness of the top electrode 40 should be no more than that of the second mask layer 60. That is, the upper surface of the top electrode 40 may be at the same level as the upper surface of the second mask layer 60, or the upper surface of the top electrode 40 may be lower than the upper surface of the second mask layer 60.

S33: removing the second mask layer 60 from the substrate 10.

Here, the manner of removing the second mask layer 60 is not limited, and for example, it may be directly peeling the second mask layer 60 from the substrate 10.

In the production method of the top electrode 40 provided in an embodiment of the present disclosure, the second mask layer 60 comprising the second hollowed-out region 61 is first attached onto the substrate 10 with the sacrificial layer 30 formed thereon and then the top electrode 40 is coated and formed in the second hollowed-out region 61 of the second mask layer 60, and the desired formed top electrode 40 may be formed by taking advantage of the characteristic that the second hollowed-out region 61 having various shapes are easily formed by the second mask layer 60.

On the above basis, optionally, the material of the first mask layer 50 comprises polyimide (PI) and a binder.

When the first mask layer 50 is produced by using a material comprising PI and a binder, the first mask layer 50 may be allowed to be adhesive, so that the first mask layer 50 may be better attached onto the substrate 10 with the bottom electrode 20 formed thereon and will be also easily removed.

Optionally, the material of the second mask layer 60 comprises PI and a binder.

When the second mask layer 60 is produced by using a material comprising PI and a binder, the second mask layer 60 may be allowed to be adhesive, so that the second mask layer 60 may be better attached onto the substrate 10 with the sacrificial layer 30 and the bottom electrode 20 formed thereon and will be easily removed.

Optionally, the tensile strength of the top electrode 40 is lower than that of the bottom electrode 20.

That is, the material of the top electrode 40 has a better tensile property compared to the material of the bottom electrode 20, so that the top electrode 40 has a stronger deformability. Therefore, when the top electrode 40 is subjected to pressure, the distance between the top electrode 40 and the bottom electrode 20 may be changed.

On the basis of above, optionally, materials of both the bottom electrode 20 and the top electrode 40 comprise silver.

Exemplarily, when the bottom electrode 20 is formed, model INKTEC TEC-CO-021 silver ink may be used; when the top electrode 40 is formed, model TOYOBO SSP2801 silver ink may be used.

On the one hand, silver has a good conductivity and thus may be used as an electrode. On the other hand, it is possible to form the bottom electrode 20 by a printing process and form the top electrode 40 by a coating process by using silver ink, so that the production is more flexible.

An embodiment of the present disclosure further provides a gap type capacitor structure. This gap type capacitor structure may be produced by the production method of the capacitor structure described above.

An embodiment of the present disclosure further provides sensor comprising a gap type capacitor structure. This gap type capacitor structure may be produced by the production method of the capacitor structure described above. This sensor has the same advantageous effects as that of the capacitor structure, and verbose words are omitted herein.

The sensor may be a pressure sensor or an acceleration sensor. With respect to a pressure sensor comprising the gap type capacitor structure described above, the capacitance value depends on the measurement of related deformation after the gap between the bottom electrode 20 and the top electrode 40 is subjected to pressure. With respect to an acceleration sensor comprising the gap type capacitor structure described above, the acceleration applied to the acceleration sensor may be determined on the basis of the change of capacitance.

The above embodiments are only specific embodiments of the present disclosure, but the scope of the present disclosure is not limited thereto. Within the technical scope disclosed by the present disclosure, any person skilled in the art will easily conceive variations or replacements, which should be covered by the scope of the present disclosure. Therefore, the protection scope of the present disclosure should be determined by the scope of the claims.

What is claimed is:

1. A production method of a capacitor structure, wherein the production method comprises:

forming a bottom electrode on a substrate;

forming a sacrificial layer, which covers at least part of the bottom electrode, on the substrate;

forming a top electrode, which traverses the bottom electrode and covers at least part of the sacrificial layer, on the substrate, such that a sacrificial layer is present at a part where an orthographic projection of the top electrode on the substrate and an orthographic projection of the bottom electrode on the substrate overlap; and removing the sacrificial layer with a sacrificial layer removing solution to form an air gap, wherein:

said forming a bottom electrode on a substrate is performed by a printing process;

said forming a sacrificial layer, which covers at least one part of the bottom electrode, on the substrate is performed by a first coating process;

said forming a top electrode, which traverses the bottom electrode and covers at least one part of the sacrificial layer, on the substrate is performed by a second coating process; and said removing the sacrificial layer with a sacrificial layer removing solution is performed by placing the substrate with the bottom electrode, the sacrificial layer, and the top electrode formed thereon in the sacrificial layer removing solution, and wherein the first coating process comprises:

attaching a first mask layer comprising a first hollowed-out region onto the substrate with the bottom electrode formed thereon, such that an orthographic projection of the first hollowed-out region on the substrate and an orthographic projection of the sacrificial layer to be formed on the substrate overlap;

forming the sacrificial layer by a coating process in the first hollowed-out region; and removing the first mask layer from the substrate.

2. The production method according to claim 1, wherein:

forming the sacrificial layer by a coating process in the first hollowed-out region comprises: coating a mixture comprising polydimethylsiloxane and a curing agent into the first hollowed-out region, heating the mixture, and forming the sacrificial layer after heat-shaping; and removing the sacrificial layer with the sacrificial layer removing solution comprises: placing the substrate with the bottom electrode, the sacrificial layer, and the top electrode formed thereon in a tetrabutylammonium fluoride solution used as the sacrificial layer removing solution, and heating the tetrabutylammonium fluoride solution to remove the sacrificial layer.

3. The production method according to claim 1, wherein the first mask layer is formed by a pressing process.

4. The production method according to claim 1, wherein materials of the first mask layer comprise polyimide and a binder.

5. The production method according to claim 1, wherein the second coating process comprises:
attaching a second mask layer comprising a second hollowed-out region onto the substrate with the sacrificial layer formed thereon, such that an orthographic projection of the second hollowed-out region on the substrate and an orthographic projection of the top electrode to be formed on the substrate overlap;
forming the top electrode by a coating process in the second hollowed-out region;
removing the second mask layer from the substrate.

6. The production method according to claim 1, wherein the substrate is a flexible substrate.

7. The production method according to claim 6, wherein forming the bottom electrode on the substrate comprises:
forming the bottom electrode which is patterned on the substrate by roll-to-roll gravure printing, and transferring the substrate with the bottom electrode formed thereon to an infrared oven of a roll-to-roll gravure printing machine to dry the bottom electrode.

8. The production method according to claim 1, wherein a tensile strength of the top electrode is lower than a tensile strength of the bottom electrode.

9. The production method according to claim 8, wherein materials of both the bottom electrode and the top electrode comprise silver.

* * * * *